(12) United States Patent
Lin et al.

(10) Patent No.: US 8,042,445 B2
(45) Date of Patent: Oct. 25, 2011

(54) CUTTING MOLD FOR RIGID-FLEXIBLE CIRCUIT BOARD AND METHOD FOR FORMING THE SAME

(75) Inventors: Yu-Lun Lin, Taoyuan County (TW);
Chih-Ming Lin, Taoyuan County (TW);
Sung-Feng Yeh, Taoyuan County (TW);
Yu-Min Chen, Taoyuan County (TW)

(73) Assignee: Nan Ya PCB Corp., Taoyuan County (TW)

( * ) Notice: Subject to any disclaimer, the term of this patent is extended or adjusted under 35 U.S.C. 154(b) by 769 days.

(21) Appl. No.: 12/131,753

(22) Filed: Jun. 2, 2008

(65) Prior Publication Data
US 2009/0232925 A1    Sep. 17, 2009

(30) Foreign Application Priority Data
Mar. 12, 2008  (TW) ................................ 97108674 A

(51) Int. Cl.
*B26D 3/08* (2006.01)
*B26D 7/06* (2006.01)
*B26D 5/08* (2006.01)
(52) U.S. Cl. .............. 83/879; 83/128; 83/526; 83/929.1
(58) Field of Classification Search ............ 83/879–883, 83/123, 128, 526, 929.1
See application file for complete search history.

(56) References Cited

U.S. PATENT DOCUMENTS

| | | | | |
|---|---|---|---|---|
| 1,476,706 | A * | 12/1923 | Furber | 83/861 |
| 2,352,339 | A * | 6/1944 | Olney | 83/883 |
| 3,137,188 | A * | 6/1964 | Domka | 83/124 |
| 3,821,911 | A * | 7/1974 | Seme | 83/885 |
| 6,065,381 | A * | 5/2000 | Kim et al. | 83/98 |
| 6,475,878 | B1 * | 11/2002 | Slepcevic | 438/460 |
| 6,925,922 | B2 * | 8/2005 | Manabe et al. | 83/694 |
| 7,156,943 | B2 * | 1/2007 | Shimizu | 156/269 |
| 2003/0200855 | A1 * | 10/2003 | Wing et al. | 83/879 |

* cited by examiner

*Primary Examiner* — Ghassem Alie
*Assistant Examiner* — Bharat C Patel

(57) ABSTRACT

A cutting mold for removing two opposite superfluous rigid circuit boards from a rigid-flexible circuit board. A first cutter is connected to a first moldboard. A first barricade is connected to the first moldboard. The maximum vertical distance from the first barricade to the first moldboard exceeds that from the first cutter to the first moldboard. A second moldboard is opposite the first moldboard. The first and second moldboards move with respect to each other. A second cutter is connected to the second moldboard and corresponds to the first cutter. A second barricade is connected to the second moldboard and detachably abuts the first barricade. The maximum vertical distance from the second barricade to the second moldboard exceeds that from the second cutter to the second moldboard. The first and second cutters cut the superfluous rigid circuit boards when the first and second moldboards move toward each other.

5 Claims, 13 Drawing Sheets

CUTTING MOLD FOR RIGID-FLEXIBLE CIRCUIT BOARD AND METHOD FOR FORMING THE SAME

CROSS REFERENCE TO RELATED APPLICATIONS

This Application claims priority of Taiwan Patent Application No. 97108674, filed on Mar. 12, 2008, the entirety of which is incorporated by reference herein.

BACKGROUND OF THE INVENTION

1. Field of the Invention

The invention relates to a method for forming a rigid-flexible circuit board, and more particularly to cutting molds for removing two opposite superfluous rigid circuit boards from a rigid-flexible circuit board.

2. Description of the Related Art

Providing flexibility, rigid-flexible circuit boards are widely employed in various electronic devices.

As to the manufacturing of a rigid-flexible circuit board, a flexible circuit board serves as a core and multilayer rigid circuit boards are laminated thereon. Top and bottom superfluous rigid circuit boards corresponding to a predetermined flexible circuit board exposure area or a predetermined flexible circuit board bending area are then removed using an outline processing technique.

As to removal of the superfluous rigid circuit boards using a mechanical outline processing technique, the flexible circuit board may be damaged because the depth by which the superfluous rigid circuit boards are cut cannot be exactly controlled. Moreover, if the flexible circuit board needs to undergo an electroless nickel and immersion gold process and a silver ink coating process, operation of the removal of the superfluous rigid circuit boards must be incorporated with additional processes, increasing complexity in removing the superfluous rigid circuit boards.

Hence, there is a need for cutting molds that exactly and easily remove two opposite superfluous rigid circuit boards corresponding to a flexible circuit board exposure area from a rigid-flexible circuit board.

BRIEF SUMMARY OF THE INVENTION

A detailed description is given in the following embodiments with reference to the accompanying drawings.

An exemplary embodiment of the invention provides a cutting mold for removing two opposite superfluous rigid circuit boards from a rigid-flexible circuit board. The cutting mold comprises a first moldboard, at least one first cutter, at least one first barricade, a second moldboard, at least one second cutter, and at least one second barricade. The first cutter is connected to the first moldboard. The first barricade is connected to the first moldboard. The maximum vertical distance from the first barricade to the first moldboard exceeds that from the first cutter to the first moldboard. The second moldboard is opposite the first moldboard. The first and second moldboards move with respect to each other. The second cutter is connected to the second moldboard and corresponds to the first cutter. The second barricade is connected to the second moldboard and detachably abuts the first barricade. The maximum vertical distance from the second barricade to the second moldboard exceeds that from the second cutter to the second moldboard. The first and second cutters cut the superfluous rigid circuit boards when the first and second moldboards move toward each other.

The rigid-flexible circuit board comprises a flexible circuit board. The difference between the maximum vertical distance from the first barricade to the first moldboard and the maximum vertical distance from the first cutter to the first moldboard exceeds half the thickness of the flexible circuit board. The difference between the maximum vertical distance from the second barricade to the second moldboard and the maximum vertical distance from the second cutter to the second moldboard exceeds half the thickness of the flexible circuit board.

The first cutter is formed with a first cutting angle, and the second cutter is formed with a second cutting angle.

The first and second cutting angles are 43°, respectively.

The cutting mold further comprises at least one third cutter and at least one fourth cutter. The third cutter is connected to the first moldboard and first cutter. The fourth cutter is connected to the second moldboard and second cutter. The maximum vertical distance from the third cutter to the first moldboard exceeds that from the first cutter to the first moldboard. The maximum vertical distance from the fourth cutter to the second moldboard exceeds that from the second cutter to the second moldboard.

The maximum vertical distance from the third cutter to the first moldboard does not exceed that from the first barricade to the first moldboard. The maximum vertical distance from the fourth cutter to the second moldboard does not exceed that from the second barricade to the second moldboard.

The cutting mold further comprises a first resilient member, a first resistant member, a second resilient member, and a second resistant member. The first resilient member is connected between the first moldboard and the first resistant member. The second resilient member is connected between the second moldboard and the second resistant member. The first and second resistant members push the superfluous rigid circuit boards.

Another exemplary embodiment of the invention provides a method for forming a rigid-flexible circuit board. The method comprises: providing a flexible circuit board; defining at least one flexible circuit board exposure area and a plurality of rigid circuit board coverage areas on the flexible circuit board, wherein the flexible circuit board exposure area is located between the rigid circuit board coverage areas; laying a dielectric layer on the flexible circuit board, wherein the dielectric layer comprises a first preformed opening corresponding to the flexible circuit board exposure area; laminating a copper clad laminate on the dielectric layer, wherein the copper clad laminate comprises a core layer, a first copper layer, and a second copper layer, the core layer is disposed between the first and second copper layers, and the first copper layer covers the dielectric layer and comprises a second preformed opening corresponding to the first preformed opening and flexible circuit board exposure area; forming a copper-layer opening on the second copper layer of the copper clad laminate, wherein the copper-layer opening corresponds to the second preformed opening, first preformed opening, and flexible circuit board exposure area; cutting the core layer corresponding to the flexible circuit board exposure area through the copper-layer opening using a cutting mold; and removing the core layer corresponding to the flexible circuit board exposure area to expose the flexible circuit board corresponding thereto.

The method further comprises covering a protective layer on the flexible circuit board corresponding to the flexible circuit board exposure area.

The method further comprises coating a solder mask layer on the second copper layer of the copper clad laminate.

The dielectric layer comprises a low-flow Prepreg.

The copper-layer opening is formed by etching.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The following description is directed to a method for forming a rigid-flexible circuit board.

Figure 1:
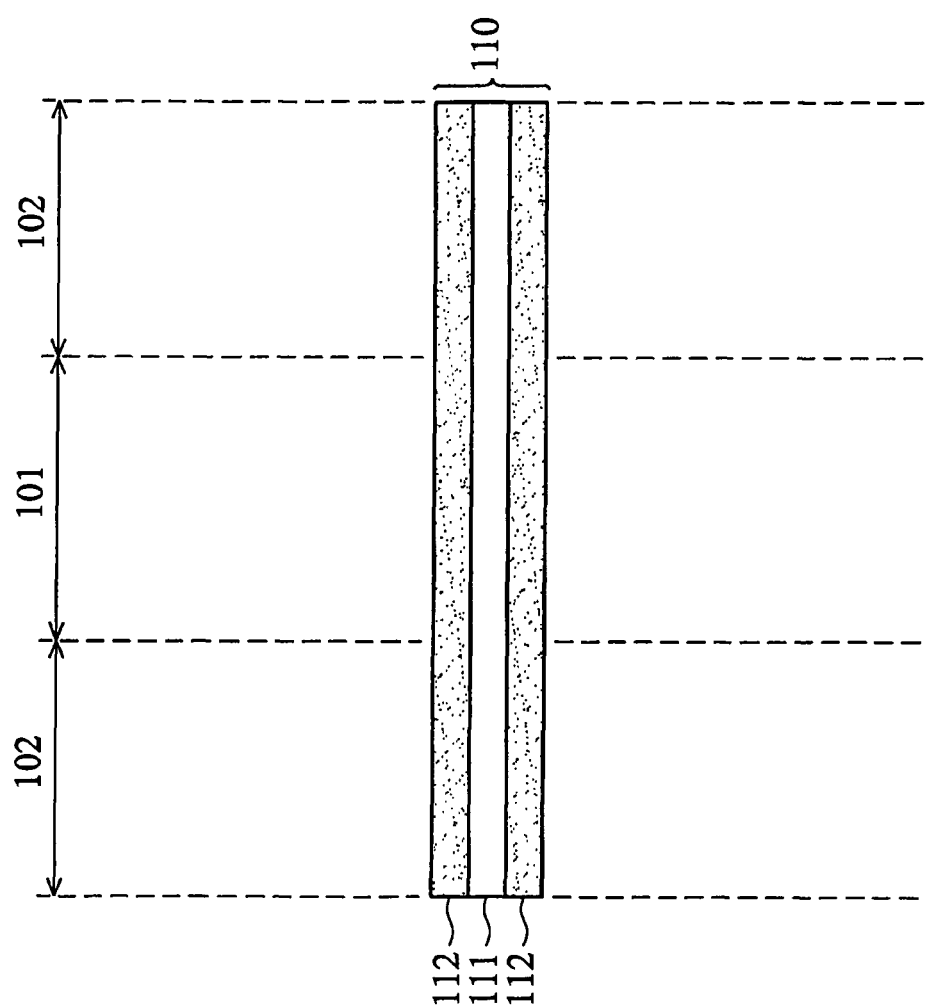
FIGS. 1-8 are schematic views showing formation of a rigid-flexible circuit board of a preferred embodiment of the invention.

Referring to FIG. 1, a flexible circuit board 110 is provided. Here, the flexible circuit board 110 comprises a base layer 111 and two copper circuit pattern layers 112. The base layer 111 is formed between the copper circuit pattern layers 112. Moreover, the base layer 111 may be composed of dielectric material, such as Polyimide (PI).

According to a practical application requirement, at least one flexible circuit board exposure area 101 and a plurality of rigid circuit board coverage areas 102 can be defined on the flexible circuit board 110. Here, the flexible circuit board exposure area 101 is located between the rigid circuit board coverage areas 102.

Figure 2:
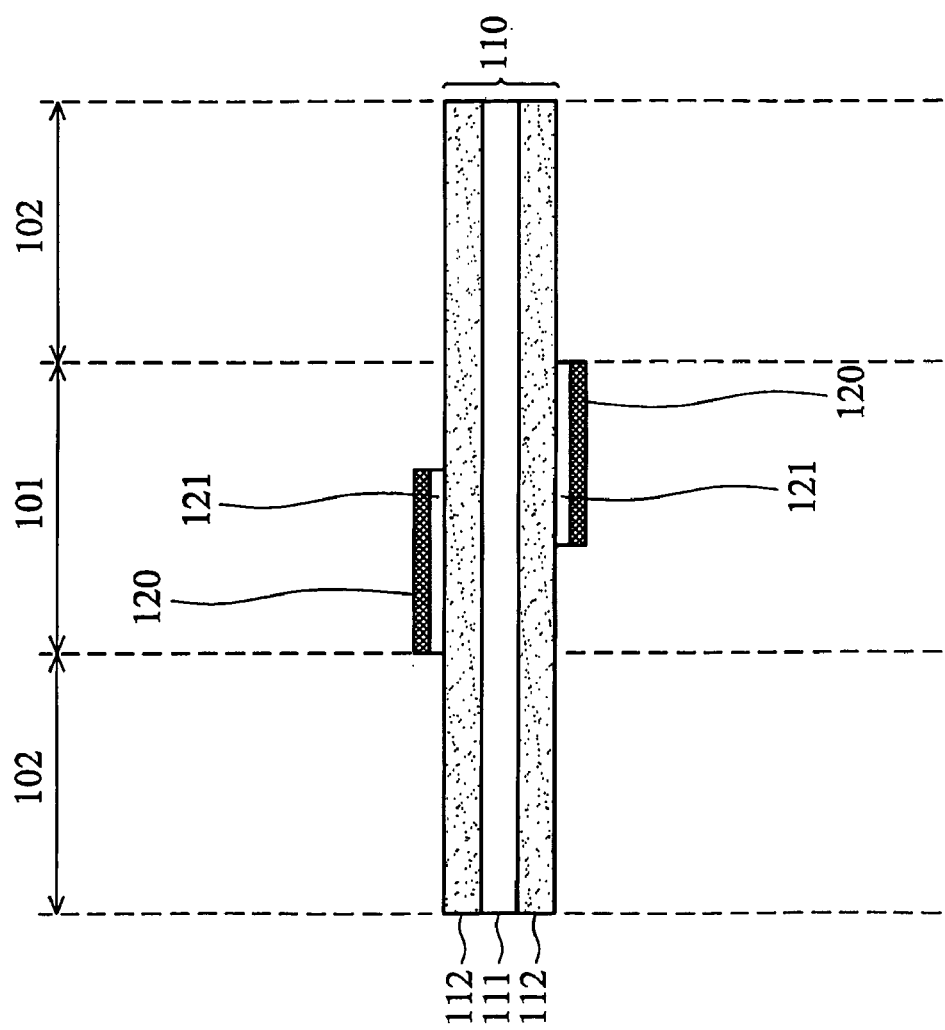

Referring to FIG. 2, two protective layers 120 are selectively covered on the flexible circuit board 110 corresponding to the flexible circuit board exposure area 101. Namely, two protective layers 120 are covered on the copper circuit pattern layers 112 of the flexible circuit board 110, respectively. Here, the protective layers 120 are respectively combined with the copper circuit pattern layers 112 by glue 121. Specifically, the protective layers 120 can protect part of the copper circuit pattern layers 112, which is not to be subjected to surface processing in subsequent procedures, from damage by chemicals (such as enchants).

Figure 3:
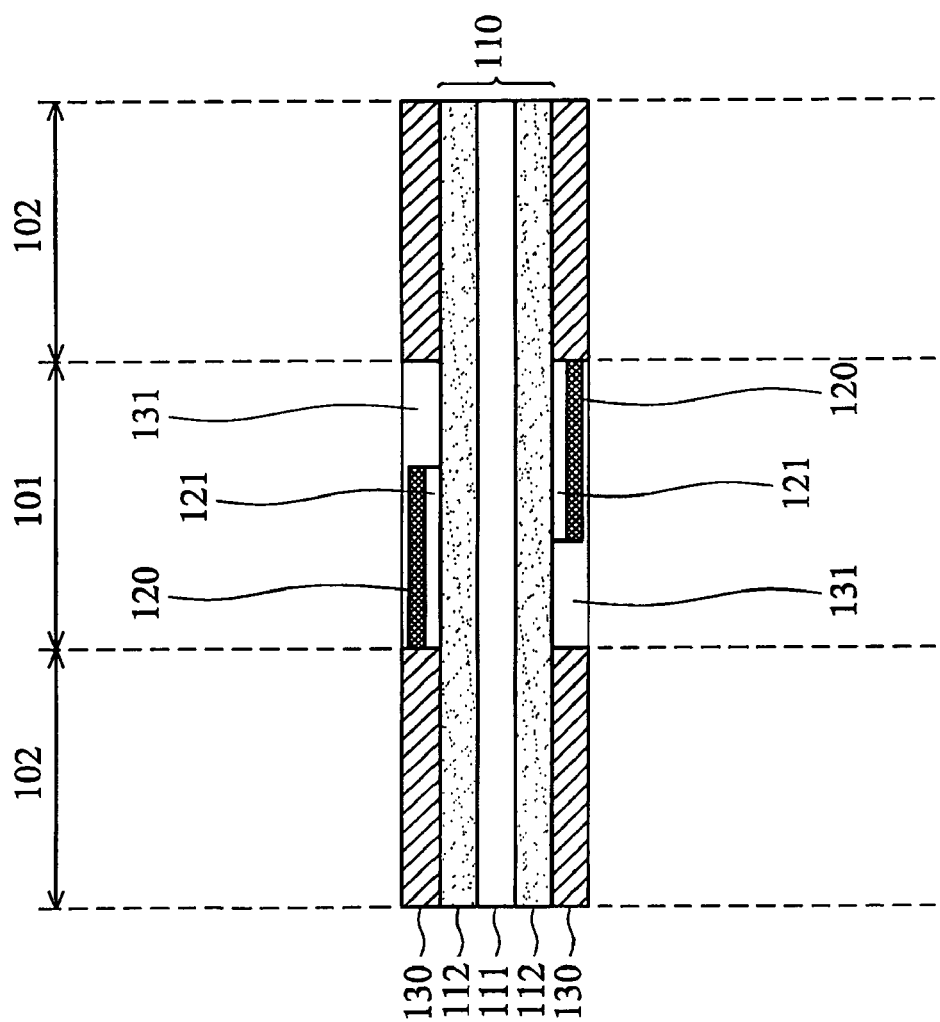

Referring to FIG. 3, two dielectric layers 130 are laid on the flexible circuit board 110. Here, each dielectric layer 130 comprises a first preformed opening 131 corresponding to the flexible circuit board exposure area 101, i.e. the size and position of the first preformed opening 131 correspond to those of the flexible circuit board exposure area 101. Moreover, the dielectric layers 130 may comprise a low-flow Prepreg.

Figure 4:
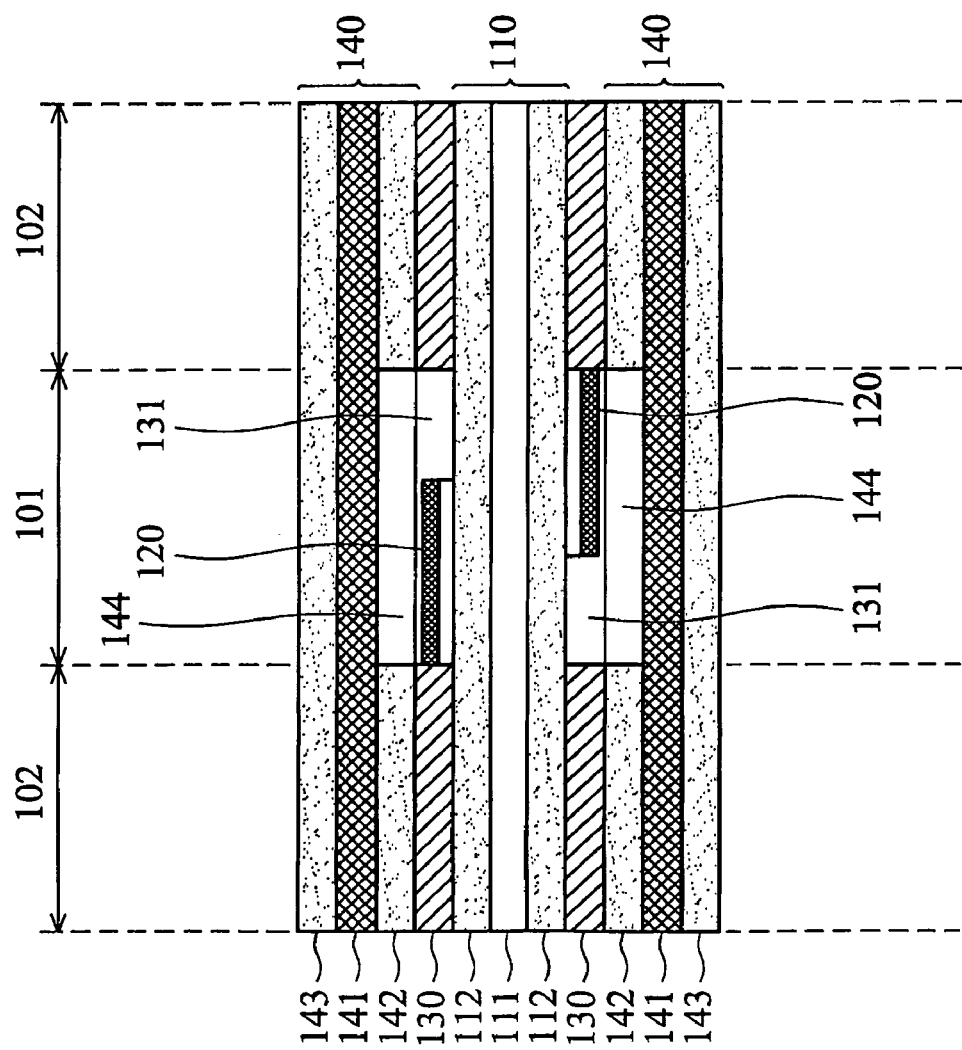

Referring to FIG. 4, two copper clad laminates 140 are laminated on the dielectric layers 130, respectively. After lamination, drilling and electroplating processes may be performed, achieving an electro-conduction effect between various layers. Each copper clad laminate 140 comprises a core layer 141, a first copper layer 142, and a second copper layer 143. The core layer 141 is disposed between the first copper layer 142 and the second copper layer 143. Each first copper layer 142 covers each dielectric layer 130 and comprises a second preformed opening 144 corresponding to the first preformed opening 131 and flexible circuit board exposure area 101, i.e. the size and position of the second preformed opening 144 correspond to those of the first preformed opening 131 and flexible circuit board exposure area 101. Moreover, the core layer 141 can provide functions of insulation and support, and the first copper layer 142 and second copper layer 143 can serve as conductors connecting to circuits of other electronic members.

Figure 5:
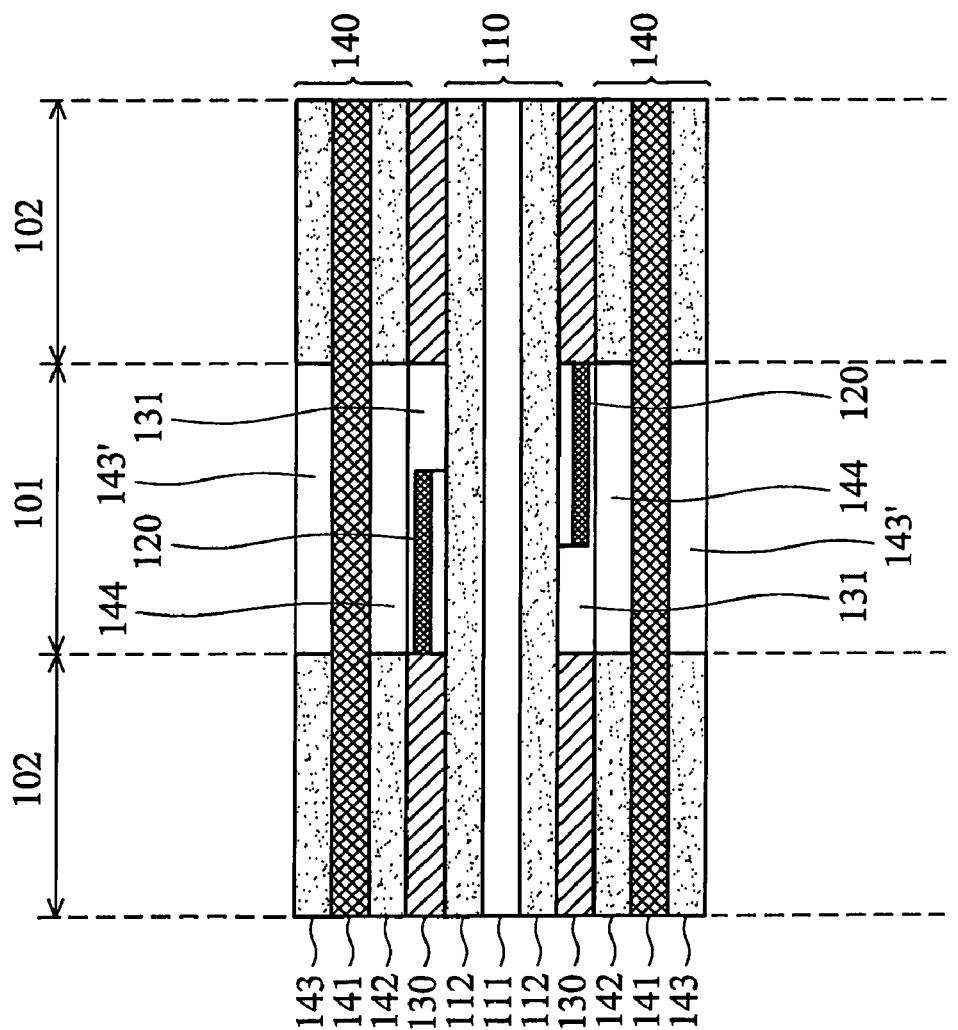

Referring to FIG. 5, a copper-layer opening 143' is formed on the second copper layer 143 of each copper clad laminate 140. Here, the copper-layer opening 143' corresponds to the second preformed opening 144, first preformed opening 131, and flexible circuit board exposure area 101, i.e. the size and position of the copper-layer opening 143' correspond to those of the second preformed opening 144, first preformed opening 131, and flexible circuit board exposure area 101. Moreover, in this embodiment, each copper-layer opening 143' is formed by etching.

Figure 6:
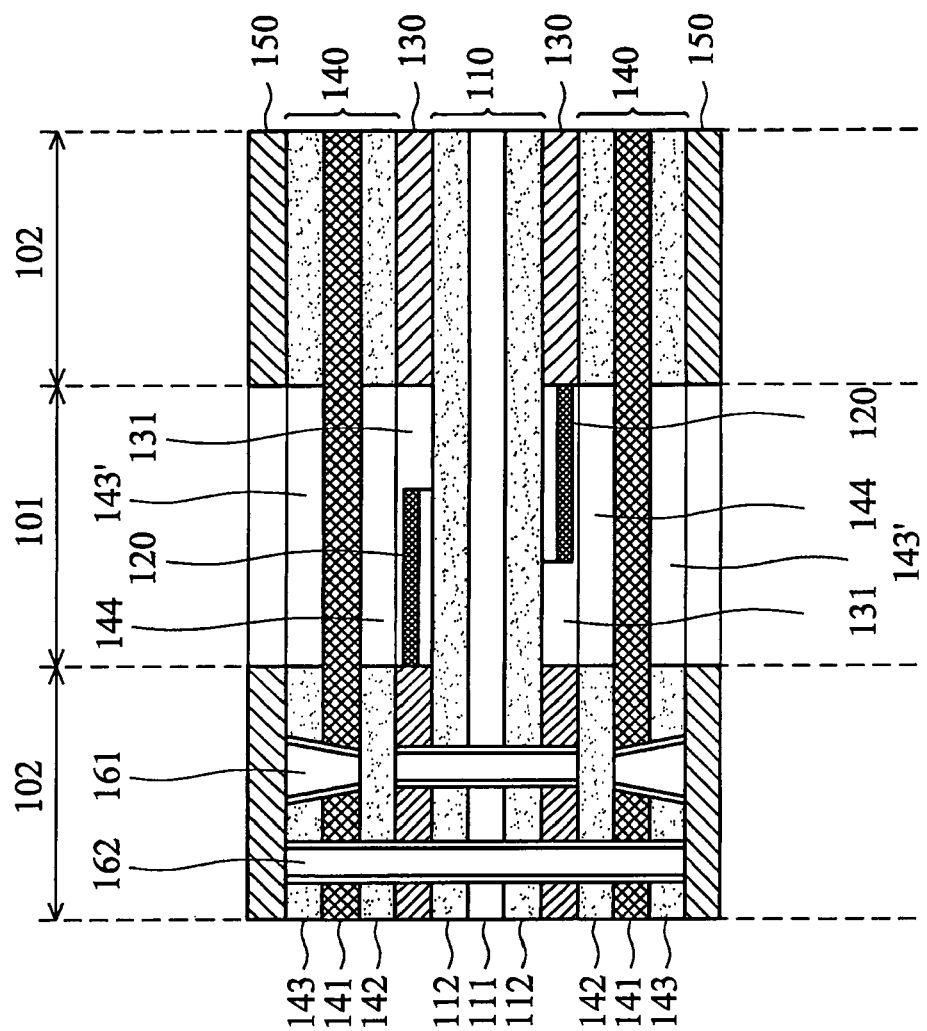

Referring to FIG. 6, a blind via 161 and a plated trough hole 162 connecting to circuits of all layers are formed in one of the rigid circuit board coverage areas 102. Then, the second copper layers 143 of the copper clad laminates 140 are coated with two solder mask layers 150, respectively.

Moreover, unlimited copper circuit pattern layers may be formed on the copper clad laminates 140. Here, the description about formation of the unlimited copper circuit pattern layers is omitted for a more clarified explanation.

Figure 7:
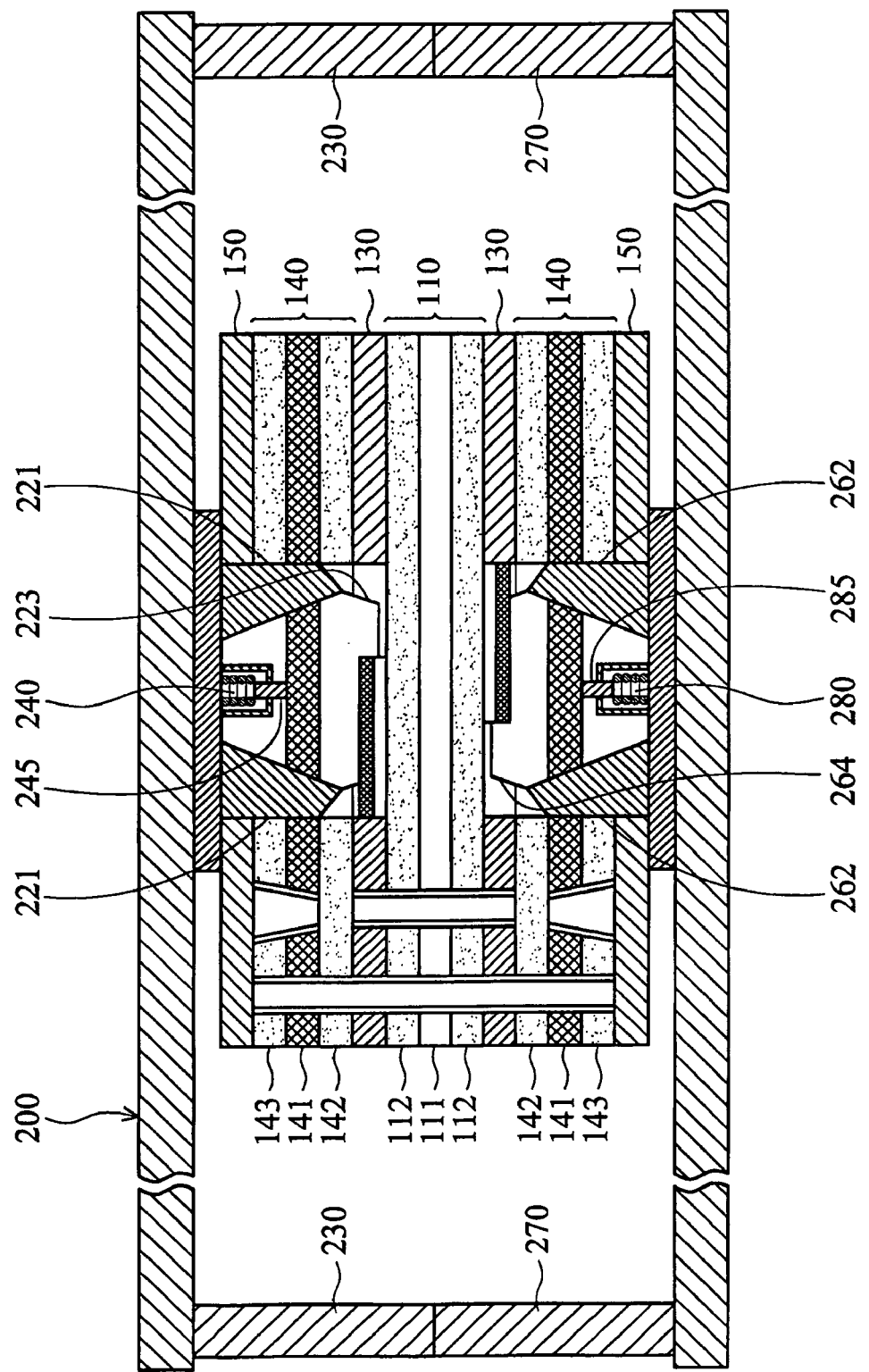

Referring to FIG. 6 and FIG. 7, a cutting mold 200 cuts the core layers 141 corresponding to the flexible circuit board exposure area 101 through the copper-layer openings 143' of the second copper layers 143. Here, the core layers 141 corresponding to the flexible circuit board exposure area 101 may be regarded as superfluous rigid circuit boards of the rigid-flexible circuit board.

Figure 8:
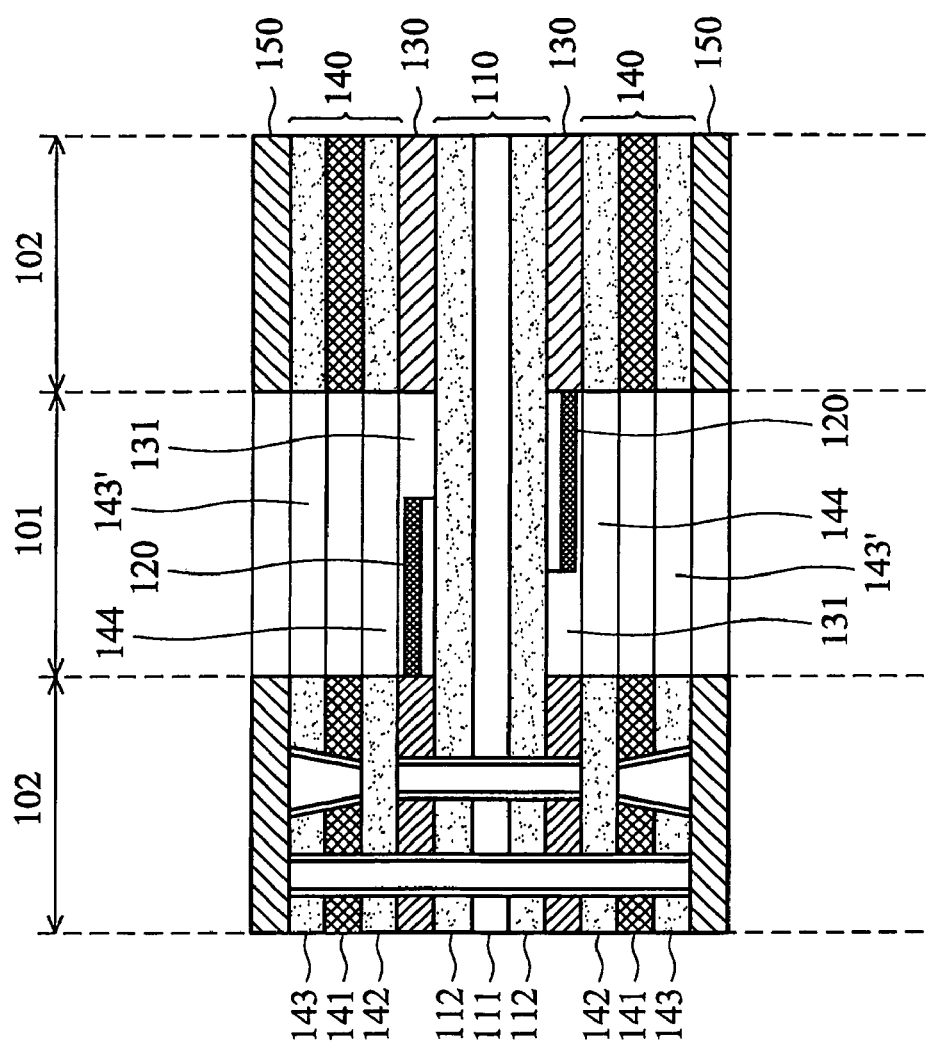

Referring to FIG. 8, the core layers 141 corresponding to the flexible circuit board exposure area 101 are removed, exposing the flexible circuit board 110 corresponding thereto.

Figure 9:
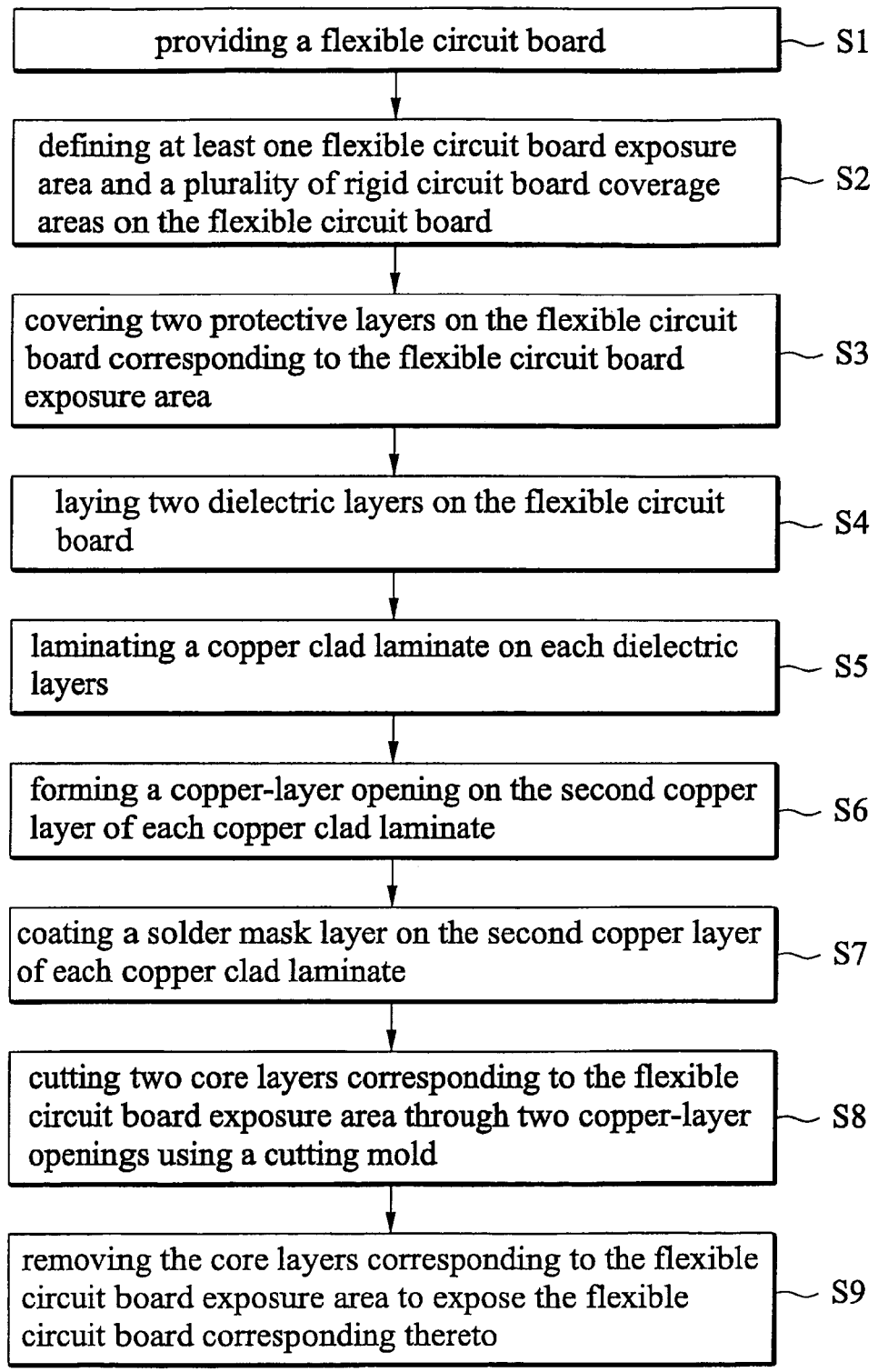
FIG. 9 is a flowchart showing formation of a rigid-flexible circuit board of a preferred embodiment of the invention.

Moreover, the aforementioned method for forming the rigid-flexible circuit board can be briefly shown by steps S1-S9 in FIG. 9.

The following description is directed to detailed explanation of the cutting mold 200.

Figure 10:
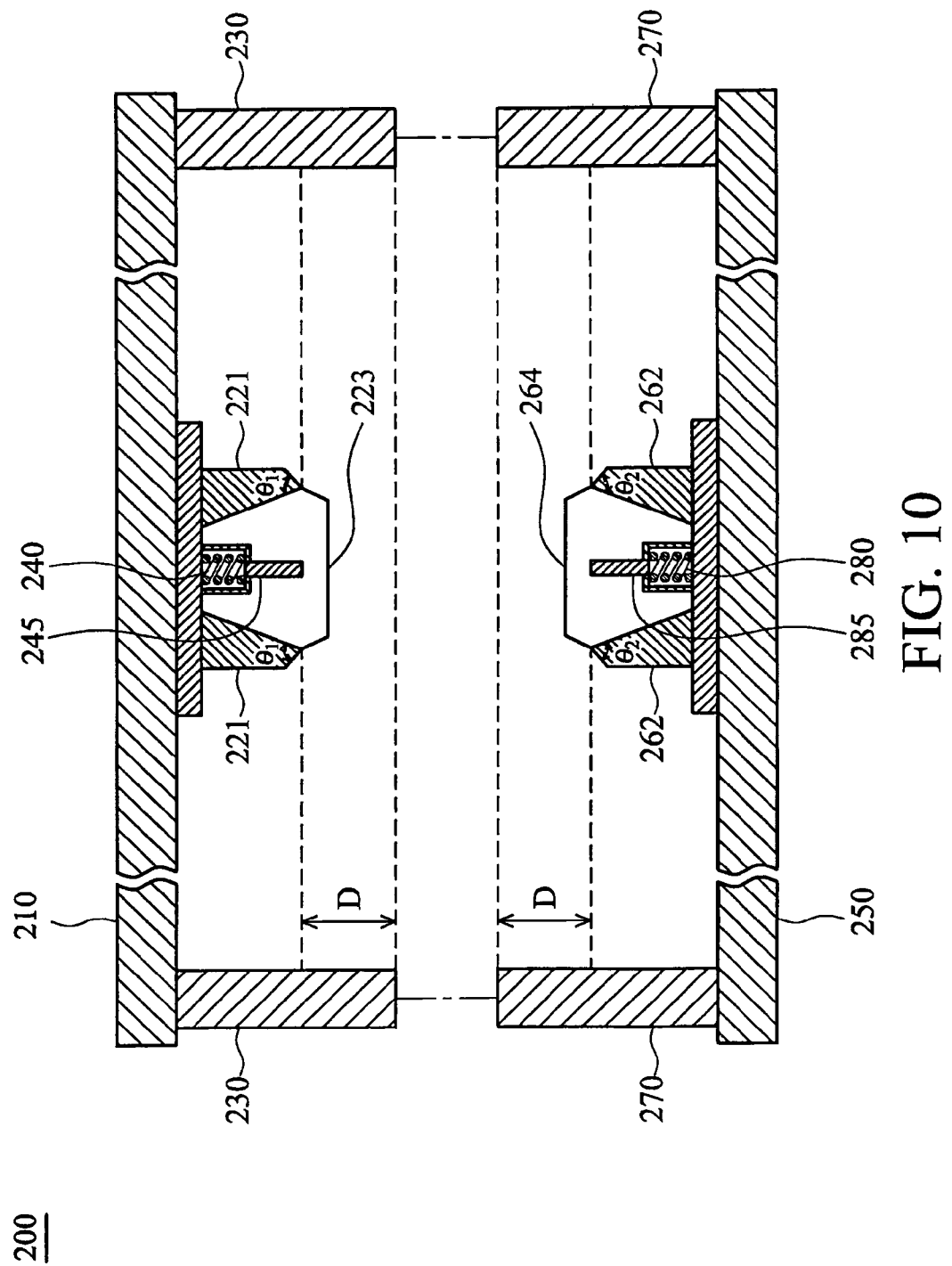
FIG. 10 is a schematic cross section of a cutting mold of an embodiment of the invention.
Figure 11:
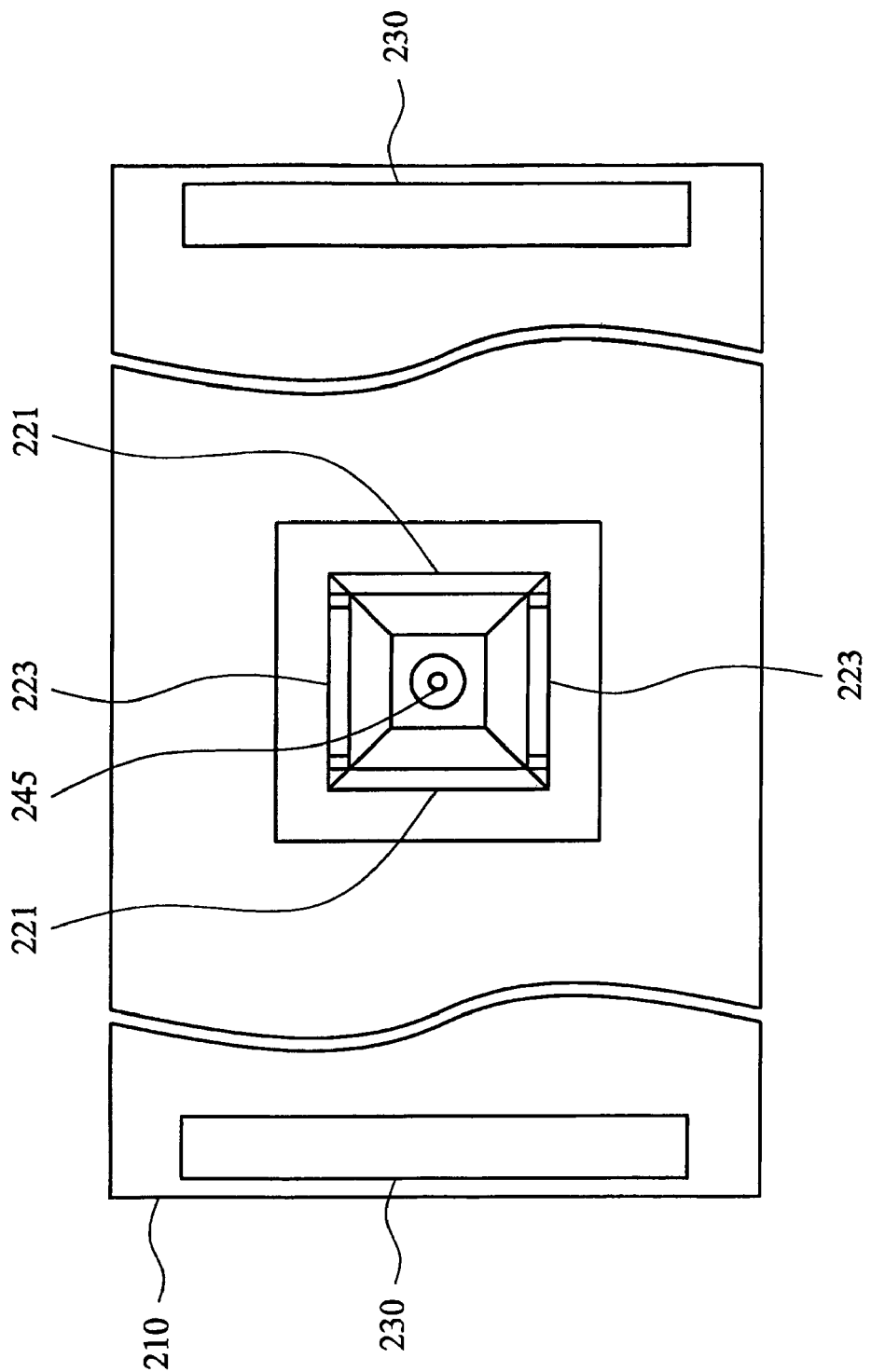
FIG. 11 is a schematic bottom view of a top mold set of the cutting mold of FIG. 10.

Referring to FIG. 10 and FIG. 11, the cutting mold 200 comprises a first moldboard 210, two first cutters 221, two third cutters 223, two first barricades 230, a first resilient member 240, a first resistant member 245, a second moldboard 250, two second cutters 262, two fourth cutters 264, two second barricades 270, a second resilient member 280, and a second resistant member 285. Here, the first moldboard 210, first cutters 221, third cutters 223, first barricades 230, first resilient member 240, and first resistant member 245 may be regarded as a top mold set of the cutting mold 200, while the second moldboard 250, second cutters 262, fourth cutters 264, second barricades 270, second resilient member 280, and second resistant member 285 may be regarded as a bottom mold set thereof. Additionally, structure of the top mold set is symmetrical to that of the bottom mold set.

Regarding the top mold set, the first cutters 221 are connected to the first moldboard 210, and the third cutters 223 are connected to the first moldboard 210 and first cutters 221. In this embodiment, the first cutters 221 and third cutters 223 are connected to each other, forming an annular structure. Specifically, the maximum vertical distance from each third cutter 223 to the first moldboard 210 exceeds that from each first cutter 221 to the first moldboard 210. Additionally, each first cutter 221 is formed with a first cutting angle $\theta_1$. The first cutting angle $\theta_1$ may preferably be 43°.

The first barricades 230 are connected to the first moldboard 210. Specifically, the maximum vertical distance from each first barricade 230 to the first moldboard 210 exceeds that from each first cutter 221 to the first moldboard 210, and the maximum vertical distance from each third cutter 223 to the first moldboard 210 does not exceed that from each first barricade 230 to the first moldboard 210. More specifically, when the top mold set is applied to form the aforementioned rigid-flexible circuit board, the difference D between the maximum vertical distance from each first barricade 230 to the first moldboard 210 and the maximum vertical distance from each first cutter 221 to the first moldboard 210 exceeds half the thickness of the flexible circuit board 110.

The first resilient member 240 is connected between the first moldboard 210 and the first resistant member 245. Thus, the first resistant member 245 can move upward and downward by the first resilient member 240.

Regarding the bottom mold set, the second moldboard 250 is opposite the first moldboard 210, and the first moldboard 210 and second moldboard 250 can move with respect to each other.

The second cutters 262 are connected to the second moldboard 250 and respectively correspond to the first cutters 221. The fourth cutters 264 are connected to the second moldboard 250 and second cutters 262. Similarly, the second cutters 262 and fourth cutters 264 are connected to each other, forming an annular structure. Specifically, the maximum vertical distance from each fourth cutter 264 to the second moldboard 250 exceeds that from each second cutter 262 to the second moldboard 250. Additionally, each second cutter 262 is formed with a second cutting angle $\theta_2$. The first cutting angle $\theta_2$ may preferably be 43°.

The second barricades 270 are connected to the second moldboard 250 and detachably abut the first barricades 230. Specifically, the maximum vertical distance from each second barricade 270 to the second moldboard 250 exceeds that from each second cutter 262 to the second moldboard 250, and the maximum vertical distance from each fourth cutter 264 to the second moldboard 250 does not exceed that from each second barricade 270 to the second moldboard 250. More specifically, when the bottom mold set is applied to form the aforementioned rigid-flexible circuit board, the difference D between the maximum vertical distance from each second barricade 270 to the second moldboard 250 and the maximum vertical distance from each second cutter 262 to the second moldboard 250 exceeds half the thickness of the flexible circuit board 110.

The second resilient member 280 is connected between the second moldboard 250 and the second resistant member 285. Similarly, the second resistant member 285 can move upward and downward by the second resilient member 280. Moreover, in this embodiment, the first resilient member 240 and second resilient member 280 may comprise springs.

Moreover, in the cutting mold 200, the first cutters 221 and second cutters 262 can cut the superfluous rigid circuit boards near the boundary between the flexible circuit board 110 and other rigid circuit boards (i.e. the core layers 141 corresponding to the flexible circuit board exposure area 101) from the rigid-flexible circuit board. Accordingly, the cutting depth provided by the first cutters 221 and second cutters 262 must be carefully controlled, protecting the flexible circuit board 110 from damage due to excessive cutting. In another aspect, the third cutters 223 and fourth cutters 264 can cut the superfluous rigid circuit boards, which are not near the boundary between the flexible circuit board 110 and the other rigid circuit boards, from the rigid-flexible circuit board. Thus, the third cutters 223 and fourth cutters 264 can provide a greater cutting depth, completely cutting off the superfluous rigid circuit boards, and further benefiting removal of the superfluous rigid circuit boards.

Accordingly, when the cutting mold 200 is applied to cut and remove two opposite superfluous rigid circuit boards (i.e. the core layers 141 corresponding to the flexible circuit board exposure area 101) from a rigid-flexible circuit board, the rigid-flexible circuit board shown in FIG. 6 can be placed between the top and bottom mold sets and the flexible circuit board exposure area 101 thereof aims at the first cutters 221 and third cutters 223 of the top mold set and the second cutters 262 and fourth cutters 264 of the bottom mold set. As shown in FIG. 7, the top and bottom mold sets move toward each other (i.e. the first moldboard 210 and second moldboard 250 move toward each other), until the first barricades 230 and second barricades 270 abut each other. At this point, the first cutters 221 and third cutters 223 of the top mold set and the second cutters 262 and fourth cutters 264 of the bottom mold set simultaneously cut through the opposite superfluous rigid circuit boards (i.e. the core layers 141) of the rigid-flexible circuit board. Here, as the maximum vertical distance from each first barricade 230 to the first moldboard 210 exceeds that from each first cutter 221 to the first moldboard 210 and the difference D between the maximum vertical distance from each first barricade 230 to the first moldboard 210 and the maximum vertical distance from each first cutter 221 to the first moldboard 210 exceeds half the thickness of the flexible circuit board 110, the first cutters 221 do not cut the flexible circuit board 110. Similarly, as the maximum vertical distance from each second barricade 270 to the second moldboard 250 exceeds that from each second cutter 262 to the second moldboard 250 and the difference D between the maximum vertical distance from each second barricade 270 to the second moldboard 250 and the maximum vertical distance from each second cutter 262 to the second moldboard 250 exceeds half the thickness of the flexible circuit board 110, the second cutters 262 do not cut the flexible circuit board 110. In another aspect, providing the greater cutting depth, the third cutters 223 and fourth cutters 264 can thoroughly cut through the opposite superfluous rigid circuit boards (core layers 141). Moreover, when the first cutters 221 and third cutters 223 of the top mold set and the second cutters 262 and fourth cutters 264 of the bottom mold set simultaneously cut through the opposite superfluous rigid circuit boards (core layers 141) of the rigid-flexible circuit board, the opposite superfluous rigid circuit boards (core layers 141) respectively push the first resistant member 245 and second resistant member 285, compressing the first resilient member 240 and second resilient member 280.

When the top and bottom mold sets separate from each other (i.e. when the first moldboard 210 and second moldboard 250 separate from each other), the opposite superfluous rigid circuit boards (core layers 141) can be separated from the rigid-flexible circuit board. Specifically, the first resistant member 245 and second resistant member 285 respectively move outward by resilience provided by the first resilient member 240 and second resilient member 280, pushing the opposite superfluous rigid circuit boards (core layers 141), and further separating the opposite superfluous rigid circuit boards (core layers 141) from the first cutters 221 and third cutters 223 of the top mold set and the second cutters 262 and fourth cutters 264 of the bottom mold set. Accordingly, removal of the opposite superfluous rigid circuit boards (core layers 141) is complete.

Moreover, the disclosed cutting mold is not limited to the structure shown in FIG. 10 and FIG. 11. For example, another cutting mold 200', as shown in FIG. 12 and FIG. 13, may also be disclosed to remove two opposite superfluous rigid circuit boards from a rigid-flexible circuit board.

Figure 12:
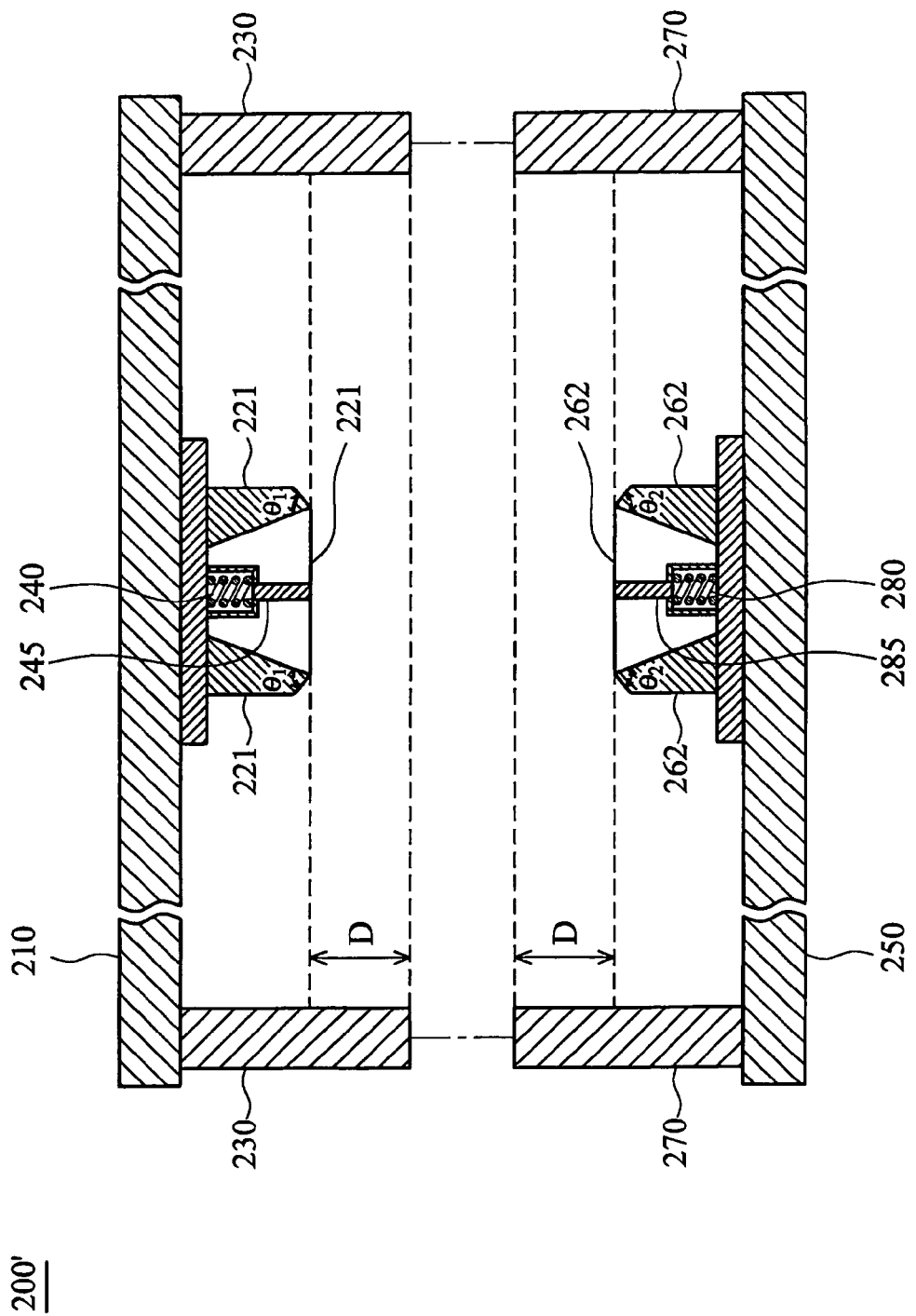
FIG. 12 is a schematic cross section of a cutting mold of another embodiment of the invention.
Figure 13:
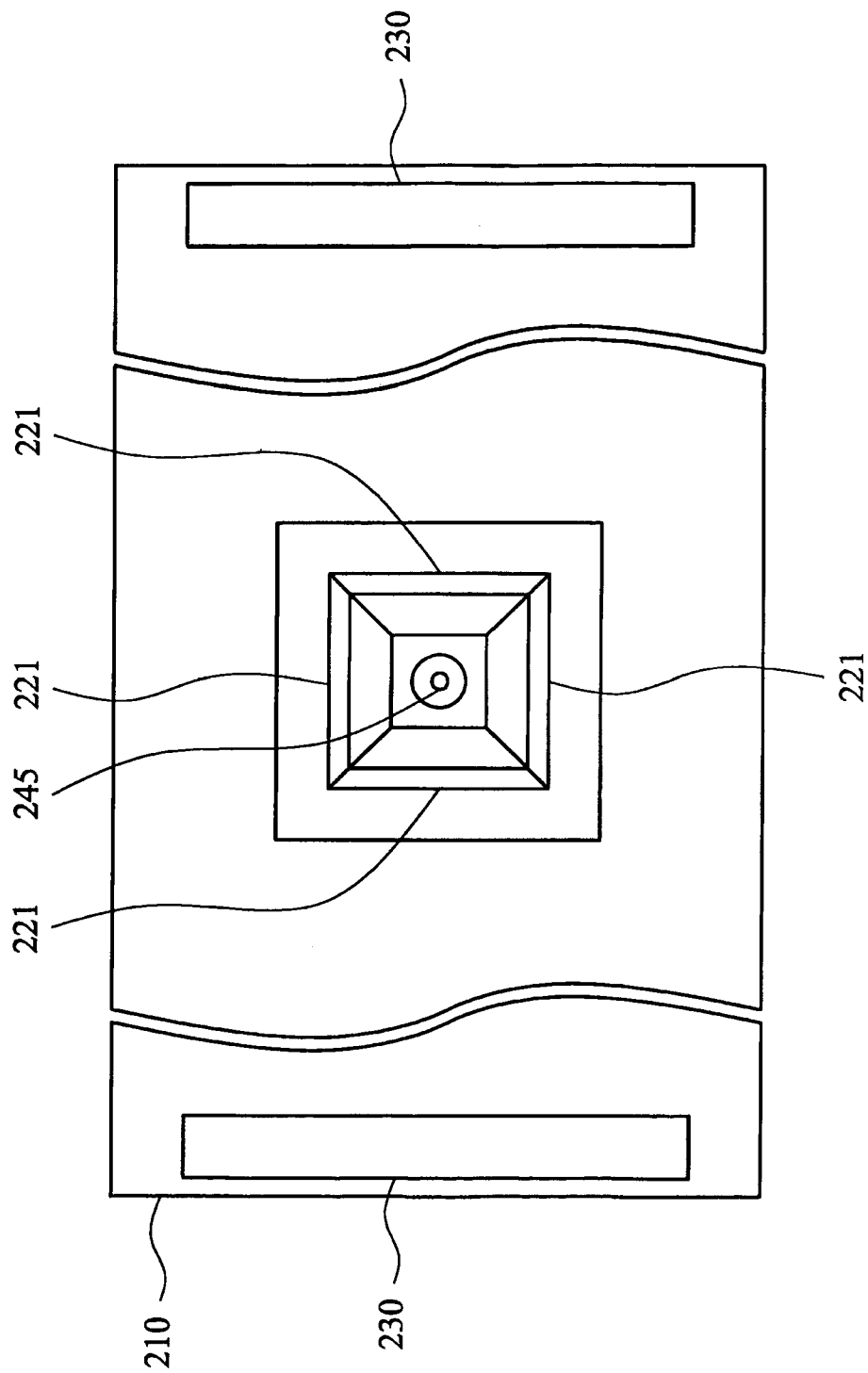
FIG. 13 is a schematic bottom view of a top mold set of the cutting mold of FIG. 12.

As shown in FIG. 12 and FIG. 13, the cutting mold 200' also comprises a top mold set and a bottom mold set. The top mold set comprises four first cutters 221 connected to each other and forming an annular structure, and the bottom mold set comprises four second cutters 262 connected to each other and forming an annular structure. Namely, the entire cutting mold 200' is applied to cut the superfluous rigid circuit boards near the boundary between the flexible circuit board 110 and other rigid circuit boards from the rigid-flexible circuit board, protecting the flexible circuit board 110 from damage due to excessive cutting. Structure, disposition, and function of other elements of the cutting mold 200' are the same as those of the cutting mold 200, and explanation thereof is omitted for descriptive brevity.

Moreover, the disclosed cutting mold 200 is not limited to having only an annular structure formed by two first cutters 221 and two third cutters 223 and only an annular structure formed by two second cutters 262 and two fourth cutters 264. Namely, based upon a cutting requirement, the cutting mold 200 may have multiple annular structures formed by the first cutters 221 and third cutters 223 and multiple annular structures formed by the second cutters 262 and fourth cutters 264. Similarly, based upon a cutting requirement, the cutting mold 200' may have multiple annular structures formed by the first cutters 221 and multiple annular structures formed by the second cutters 262.

Additionally, to comply with a practical cutting requirement, a top mold set of another cutting mold may comprise one or more annular structures formed by two first cutters 221 and two third cutters 223 and one or more annular structures formed by four first cutters 221, and a bottom mold set thereof may comprise one or more annular structures formed by two second cutters 262 and two fourth cutters 264 and one or more annular structures formed by four second cutters 262. Accordingly, flexibility in application of the cutting mold is enhanced.

Moreover, the first cutters, second cutters, third cutters, and fourth cutters of the disclosed cutting molds are not limited to having the profiles shown in FIGS. 10, 11, 12, and 13. Namely, the profiles of the first cutters, second cutters, third cutters, and fourth cutters may vary with practical cutting requirements.

In conclusion, the disclosed cutting molds can exactly and easily remove top and bottom superfluous rigid circuit boards corresponding to a flexible circuit board exposure area from a rigid-flexible circuit board, facilitating formation of the rigid-flexible circuit board, and further reducing manufacturing costs thereof.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cutting mold for removing two opposite superfluous rigid circuit boards from a rigid-flexible circuit board, comprising:
   a first moldboard;
   at least one first cutter connected to the first moldboard;
   at least one first barricade connected to the first moldboard, wherein the maximum vertical distance from the first barricade to the first moldboard exceeds that from the first cutter to the first moldboard;
   a second moldboard opposite the first moldboard, wherein the first and second moldboards move with respect to each other;
   at least one second cutter connected to the second moldboard and corresponding to the first cutter; and
   at least one second barricade connected to the second moldboard and detachably abutting the first barricade, wherein the maximum vertical distance from the second barricade to the second moldboard exceeds that from the second cutter to the second moldboard, and the first and second cutters cut the superfluous rigid circuit boards when the first and second moldboards move toward each other;
   wherein the rigid-flexible circuit board comprises a flexible circuit board, the difference between the maximum vertical distance from the first barricade to the first moldboard and the maximum vertical distance from the first cutter to the first moldboard exceeds half the thickness of the flexible circuit board, and the difference between the maximum vertical distance from the second barricade to the second moldboard and the maximum vertical distance from the second cutter to the second moldboard exceeds half the thickness of the flexible circuit board; and
   wherein at least one third cutter and at least one fourth cutter, wherein the third cutter is connected to the first moldboard and first cutter, the fourth cutter is connected to the second moldboard and second cutter, the maximum vertical distance from the third cutter to the first moldboard exceeds that from the first cutter to the first moldboard, and the maximum vertical distance from the fourth cutter to the second moldboard exceeds that from the second cutter to the second moldboard.

2. The cutting mold as claimed in claim 1, wherein the first cutter is formed with a first cutting angle, and the second cutter is formed with a second cutting angle.

3. The cutting mold as claimed in claim 2, wherein the first and second cutting angles are 43°, respectively.

4. The cutting mold as claimed in claim 1, wherein the maximum vertical distance from the third cutter to the first moldboard does not exceed that from the first barricade to the first moldboard, and the maximum vertical distance from the fourth cutter to the second moldboard does not exceed that from the second barricade to the second moldboard.

5. The cutting mold as claimed in claim 1, further comprising a first resilient member, a first resistant member, a second resilient member, and a second resistant member, wherein the first resilient member is connected between the first moldboard and the first resistant member, the second resilient member is connected between the second moldboard and the second resistant member, and the first and second resistant members push the superfluous rigid circuit boards.

* * * * *